United States Patent [19]
Baum et al.

[11] Patent Number: 5,462,897
[45] Date of Patent: Oct. 31, 1995

[54] METHOD FOR FORMING A THIN FILM LAYER

[75] Inventors: Thomas H. Baum, San Jose, Calif.; Shyama P. Mukherjee, Hopewell Junction, N.Y.; Terrence R. O'Toole, Webster, N.Y.; Alice F. Tai, Stormville, N.Y.; Alfred Viehbeck, Fishkill, N.Y.

[73] Assignee: International Business Machines Corporation, Armonk, N.Y.

[21] Appl. No.: 11,633

[22] Filed: Feb. 1, 1993

[51] Int. Cl.$^6$ .................... H01L 21/02; C23C 26/00
[52] U.S. Cl. .................... 437/230; 427/98; 427/304; 427/305; 427/427
[58] Field of Search .................... 437/230; 427/437, 427/98, 304–306, 431, 436, 438, 443.1

[56] References Cited

U.S. PATENT DOCUMENTS

| | | | |
|---|---|---|---|
| 4,297,393 | 10/1981 | Denning et al. | 427/88 |
| 4,574,095 | 4/1986 | Baum et al. | 427/53.1 |
| 4,738,869 | 4/1988 | Baumgartner | 427/54.1 |
| 4,910,049 | 3/1990 | Bindra et al. | 427/305 |
| 5,017,516 | 5/1991 | van der Putten | 437/230 |
| 5,075,259 | 12/1991 | Moran | 437/230 |
| 5,088,003 | 2/1992 | Sakai et al. | 361/330 |
| 5,098,860 | 3/1992 | Chakravorty et al. | 437/195 |
| 5,122,477 | 6/1992 | Wolters et al. | 437/60 |
| 5,167,992 | 12/1992 | Lin et al. | 427/437 |
| 5,178,914 | 1/1993 | Goldblatt et al. | 427/306 |
| 5,240,879 | 8/1993 | De Bouin | 437/190 |

FOREIGN PATENT DOCUMENTS

| | | | |
|---|---|---|---|
| 0280918 | 5/1988 | European Pat. Off. . | |
| 4307737 | 10/1992 | Japan | 437/230 |

OTHER PUBLICATIONS

Wolf, "Silicon processing for the VLSI Era. vol. II", pp. 256–257, 1990.

*Primary Examiner*—Mary Wilczewski
*Assistant Examiner*—Richard A. Booth
*Attorney, Agent, or Firm*—Ira David Blecker

[57] ABSTRACT

A method for forming a thin film layer on a dielectric substrate. A nonconducting layer of material is blanket deposited on the dielectric substrate followed by a layer of polymeric dielectric material which is then patterned to partially expose the underlying layer of nonconducting material. The exposed underlying layer of material is contacted with a metallic salt solution. A key part of the present invention is the layer of nonconducting material which catalyzes the deposition of a seed layer from the metallic salt solution. Then, additional metallization may be easily electrolessly plated on the seed layer.

11 Claims, 1 Drawing Sheet

METHOD FOR FORMING A THIN FILM LAYER

BACKGROUND OF THE INVENTION

The present invention relates to a process for forming thin film wiring patterns on a dielectric substrate. In particular, the present invention relates to a process for selectively applying metallization by an electroless plating method.

Semiconductor packaging technology has progressed beyond the simple dielectric substrates due to the speed and dimensional requirements of advanced devices. These dielectric substrates may be organic in nature such as the conventional epoxy/fiberglass printed circuit boards or the more advanced sintered inorganic dielectric substrates having co-fired metallurgy. The use of thin metallized layers of organic dielectrics (so-called thin film layers) has become widely accepted as the solution addressing the new technological requirements. Ideally, the underlying dielectric substrate provides the interconnection capability for mating with the next level of packaging, the basic power supply wiring, and a metallized top surface for supporting multiple organic signal wiring layers. Structures have been proposed having multiple thin organic layers with associated signal metallurgy on the top surface of the dielectric substrate. However, the fabrication of multilayer metallized organic structures is difficult to achieve using the processing techniques which are standard in the semiconductor and package processing industries.

Challenges to fabrication of a multilayer organic structure include adhesion of the polymeric material to both the associated metallurgy and the subsequently-deposited layers of polymeric material. The adhesion, the mechanical integrity and the electrical integrity of an organic layer can be influenced by the amount and type of processing to which it is exposed. Therefore, it is desirable to minimize the processing of the multilayers in order not to compromise the properties of the materials and thereby the mechanical and electrical integrity of the structure.

Typical multilayer organic structures utilize multiple high vacuum metal sputtering and photolithographic operations to define the wiring metallization. These complicated operations contribute to the lengthy raw cycle time to complete a structure and the low yields obtained. The use of electroless plating operations has the potential for significantly reducing the number of process steps and capital costs associated with metallization. However, the full impact of the electroless plating approach can only be realized by being able to selectively plate only those regions where metallization is desired.

Accordingly, it is a purpose of the present invention to have a process for forming an organic structure, which may be a multilayer structure, in which the number of processing steps is reduced.

It is another purpose of the present invention to have a process for forming an organic structure wherein adhesion is promoted between the metallization and the organic material.

It is a final purpose of the present invention to have a process for forming an organic structure wherein the metallization is selectively deposited by an electroless plating procedure.

These and other purposes of the invention will become more apparent after referring to the following description considered in conjunction with the accompanying drawings.

BRIEF SUMMARY OF THE INVENTION

The purposes of the present invention have been achieved by providing a method for forming a thin film layer on an electronic substrate, the method comprising the steps of:

(a) obtaining a dielectric substrate;

(b) blanket depositing a nonconducting layer of material;

(c) blanket depositing a layer of polymeric dielectric material over the nonconducting layer of material;

(d) patterning said polymeric material so as to partially expose the underlying layer of nonconducting material;

(e) contacting said exposed underlying layer of nonconducting material with a palladium, platinum, silver, nickel, or gold salt solution whereby palladium, platinum, silver, nickel, or gold, respectively, is deposited as a seed layer; and (f) electrolessly plate at least one additional layer of metallization on said seed layer.

DETAILED DESCRIPTION OF THE INVENTION

Figure 1A:
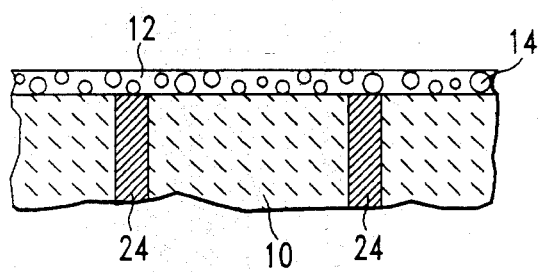
FIGS. 1A to 1D are cross sectional views of a dielectric substrate illustrating a first embodiment of a method for forming a thin film wiring layer.

Referring to the drawings in more detail, there is illustrated according to the invention a method for forming a thin film layer on a dielectric substrate which is especially suited for electronic applications. The dielectric substrate may also be called an electronic substrate. Typical substrates useful in the present process include, for example, glass, alumina, glass-ceramic, and organic materials such as polyimide and epoxy/fiberglass.

In general terms, the process according to the invention includes the following process steps:

(a) obtaining a dielectric substrate;

(b) blanket depositing a nonconducting layer of material on the dielectric substrate;

(c) blanket depositing a layer of polymeric dielectric material over the nonconducting layer of material;

(d) patterning said polymeric material so as to partially expose the underlying layer of nonconducting material;

(e) contacting said exposed underlying layer of nonconducting material with at least one of a palladium, platinum, silver, copper, nickel, or gold salt solution whereby palladium, platinum, silver, copper, nickel, or gold, respectively, is deposited as a seed layer; and (f) electrolessly plating at least one additional layer of metallization on said seed layer.

A key part of the process is the provision of the layer of nonconducting material which catalyzes the deposition of the metallic salt.

A first embodiment of the invention is illustrated in FIG. 1. Referring first to FIG. 1A, a nonconducting layer 12 of material is blanket deposited on the dielectric substrate 10 which may have vias 24. The nonconducting layer 12 of material in this embodiment is a sol-gel, preferably a silicon alkoxide. The sol-gel film is typically applied in a thickness of 200 to 400 angstroms by spin coating. The thickness of the sol-gel film 12 is exaggerated for clarity.

Sol-gel is a broad term used to describe bulk or thin film glassy or crystalline oxides via the polymerization of metal alkoxides from a precursor solution. The formation of a highly porous glassy film occurs when the polymeric sol solution transforms into a solid elastic gel layer at room temperature on evaporation of the organic solvent (e.g. an alcohol). The porous structure on thermal treatment at a temperature of, for example, 250 to 350 degrees Centigrade, converts into an inorganic glassy film upon the removal of residual adsorbed organic molecules.

Sol-gels and their method of formation are well known to those skilled in the art as illustrated, for example, in Mukherjee et al. European Patent Application EP-280918, the disclosure of which is incorporated by reference herein. Briefly, a sol-gel may be formed by mixing one mole of tetraethoxy silane (TEOS) with 5 to 7 moles of water. Nitric acid is added to reach a pH between 1 and 2. The solution is stirred for 1 to 2 hours. Then, the solution may be spin applied at about 5000 RPM to a suitable dielectric substrate.

As shown in FIG. 1A, the sol-gel film 12 has been applied to dielectric substrate 10. As a result of processing, the sol-gel film 12 has pores or void areas 14.

Figure 1B:
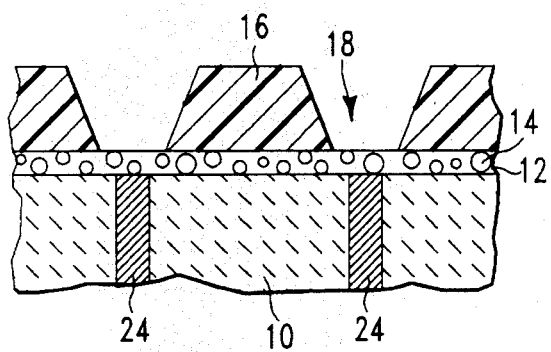

Thereafter, a layer of insulator, such as polymeric dielectric material 16 is blanket deposited over the sol-gel film 12. The preferred polymeric dielectric material 16 is a polyimide, which is a well-known material suitable for electronic applications. Then, the polymeric dielectric material 16 is patterned as shown in FIG. 1B so as to form openings 18 which are in communication with the underlying sol-gel film 12. The polymeric dielectric material 16 may be patterned by, for example, laser ablation. Alternatively, the polymeric dielectric material 16 may be chosen to be photosensitive, such as a photosensitive polyimide, for example, which may then be patterned by conventional photolithographic techniques.

The underlying sol-gel film that is exposed, such as in areas 18, is then contacted with a seeding solution.

Figure 1C:
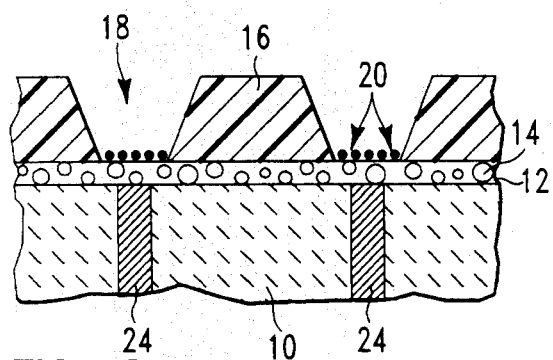

The seeding solution comprises an aqueous salt solution. The salt should be that of the metal to be deposited and may be selected from palladium, platinum, silver, copper, nickel or gold salts. The metal deposited would then be palladium, platinum, silver, copper, nickel or gold, respectively. Some preferred salts are $PdCl_2$, $PdSO_4$ or palladium [bis-acetylacetonate]. After seeding, the substrate is rinsed in water and then heated, preferably, in forming gas ($N_2+H_2$) to a temperature of about 300 to 450 degrees Centigrade to reduce the salt to the elemental form. The dielectric substrate 10 having sol-gel film 12 now has seed metal 20 on top of sol-gel film 12 as shown in FIG. 1C. The seed metal 20 would also be deposited within the pores 14 of the sol-gel film 12.

Figure 1D:
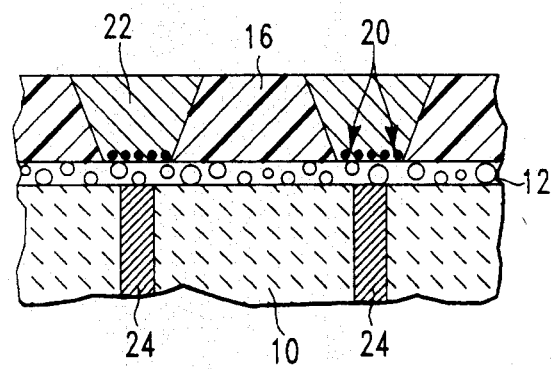

The substrate may then undergo electroless plating. The presence of the seed 20 only in selected areas 18 assures that the deposited metal from the electroless plating will only deposit in these selected areas. Electroless plating is, of course, well known to those skilled in the art and many different metals may be easily deposited by electroless plating. The preferred metals for the present invention are nickel and copper and it is most preferred that the metals be deposited in sequential layers of nickel, copper and then nickel again. The final structure is shown in FIG. 1D with electroless plated metallization 22 in areas 18 of patterned polymeric dielectric material 16.

Figure 2A:
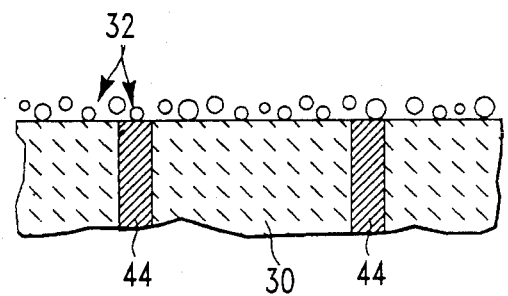
FIGS. 2A to 2D are cross sectional views of a dielectric substrate illustrating a second embodiment of a method for forming a thin film wiring layer.

A second embodiment of the invention is shown in FIGS. 2A–2D. As shown in FIG. 2A, dielectric substrate 30 (of the type discussed above) has a blanket deposition of a nonconducting layer of material. Dielectric substrate 30 may also have vias 44. In this embodiment of the invention, however, the nonconducting layer of material comprises particles 32 of semiconductor material. The choice of semiconductor materials will be discussed below. The semiconductor particles 32 may be simply applied to the surface of dielectric substrate 30. Alternatively, they may be mixed with a polymeric material, such as a polyimide, and then applied.

Figure 2B:
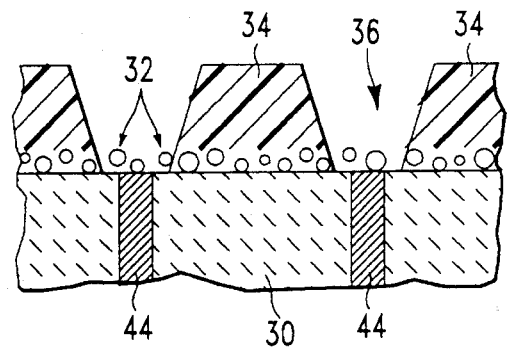

Next, a layer of insulator material 34, such as a polymeric dielectric material, again preferably a polyimide, is blanket deposited over the semiconductor particles 32 and patterned as before to form open areas 36. Note that open areas 36 expose the underlying semiconductor particles 32. The structure thus far is illustrated in FIG. 2B.

Figure 2C:
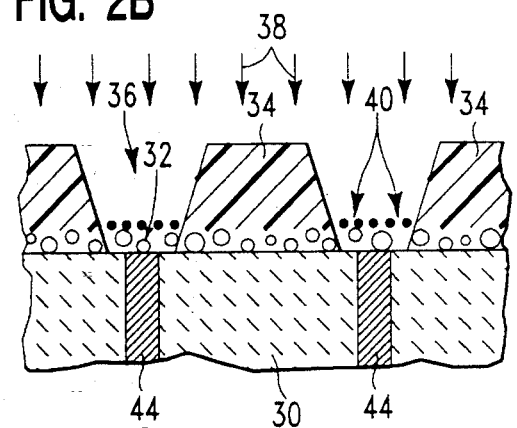

The semiconductor particles 32 are then contacted with a seeding or metallic salt solution. Simultaneously, the semiconductor particles 32 are irradiated with a light source. The radiation from the light source is shown as 38 in FIG. 2C. Only the areas 36 in polymeric dielectric material 34 need to be irradiated but the entire dielectric material 34 may be flooded with radiation 38 so that a mask becomes unnecessary. The semiconductor particles 32 and light source (not shown) need to be selected so that upon exposure by the light source, energy greater than the band gap of the semiconductor material is imparted to the semiconductor particles to cause the semiconductor particles to become conducting. As a result, a metal seed from the salt solution is then deposited on the semiconductor particles 32 to form seed layer 40, as shown in FIG. 2C. Preferred semiconductor particles include $TiO_2$, $WO_3$, $Al_2O_3$, $RuO_2$, $ZnO_2$ and $SiO_2$. The metallic salt solution may be any of the salt solutions discussed above.

Figure 2D:
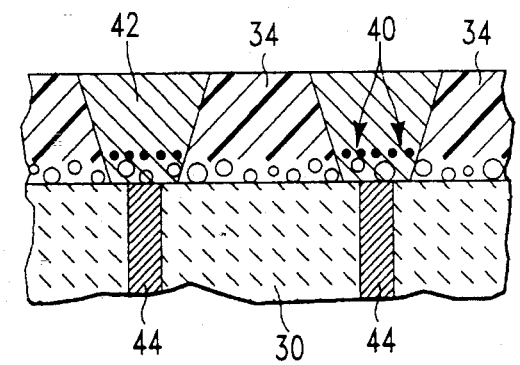

Finally, as shown in FIG. 2D, metallization 42 is electrolessly plated upon seed layer 40 as discussed with respect to the previous embodiment of the invention.

As can be appreciated, a particular advantage of the present invention is that the nonconductive layer can be blanket applied. Since it is nonconducting until selected parts of it are seeded, there is no danger of any significant electrical or ionic leakage between conductor features.

The advantages of the present invention will become more apparent after referring to the following examples.

EXAMPLES

Example 1

A composite film of titanium dioxide blended with polyimide for catalyzing electroless plating was prepared in the following manner. Titanium dioxide (anatase powder) was treated at 400 degrees Centigrade under a 5% $H_2+N_2$ gas for 3 hours to reduce ("dope") the titanium dioxide and dry it. The titanium dioxide was added to a 5% by weight polyamic acid (DuPont PI-2525) in N-methylpyrrolidone (NMP) solution to yield a 1% by weight mixture. The titanium dioxide ($TiO_2$)/polyamic acid solution was spin coated onto pyrex glass wafers at 2000 RPM and subsequently cured at 400 degrees Centigrade under a 5% $H_2+N_2$ environment for 60 minutes.

The film coated wafer was then immersed in a neutral aqueous solution containing 0.5M sodium acetate and 2 mM $PdCl_2$.

An o-ring connection was used to position the wafer against an Ultraviolet (UV) transparent cell window. Nitrogen gas was bubbled through the solution to remove dissolved oxygen. The immersed film was then exposed to a 150 watt xenon/mercury lamp and 345 nanometer cutoff filter for 30 minutes. This treatment resulted in the appearance of light colored particles on the surface of the polyimide film. The sample was then removed and rinsed with deionized water to remove the excess salt solution. On immersing this seeded sample in a conventional formaldehyde-based electroless copper plating solution, there was visible signs of copper deposition onto the regions exposed to the UV radiation. No plating occurred on areas which were masked by the o-ring connection.

Example 2

A second sample was prepared in a manner identical to that of Example 1, except that the semiconductor particles were the rutile form of titanium dioxide. The results obtained were identical to that obtained with the anatase form of titanium dioxide in Example 1.

Example 3

The following procedure was used to prepare a polyimide film having a surface layer of dispersed titanium dioxide semiconductor particles.

A 5 micron thick polyimide film (DuPont PI-2811) was coated onto a pyrex glass wafer and cured to 400 degrees Centigrade in a 5% $H_2+N_2$ gas for 60 minutes. The film was then exposed to a 1M potassium hydroxide solution at 45 degrees Centigrade for 60 minutes to hydrolyze the polyimide film surface.

Separately, a 5% by weight "doped" titanium dioxide (rutile) dispersion was made using 1M sulfuric acid. The polyimide film having the hydrolyzed surface was then immersed in the titanium dioxide dispersion solution for 15 minutes, then removed and rinsed with deionized water. A whitish haze due to the presence of the titanium dioxide was noticed on the surface. The sample was then heated to 200 degrees Centigrade for 30 minutes to dry the film.

Thereafter, the sample was immersed in a salt solution and exposed to UV light identically to that of Examples 1 and 2. This treatment resulted in darkening of the surface due to deposition of palladium onto the exposed titanium dioxide particles. The sample was then removed and rinsed with deionized water to remove any excess palladium salt solution.

The seeded sample was immersed in a conventional formaldehyde-based electroless copper plating solution with the result that there was rapid electroless copper deposition onto the regions exposed to the UV radiation. No plating occurred on areas which were masked by the rubber o-ring mount.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for forming a thin film layer on an electronic substrate, the method comprising the steps of:
   (a) obtaining a dielectric substrate;
   (b) blanket depositing a nonconducting layer of material on the dielectric substrate;
   (c) blanket depositing a layer of polymeric dielectric material over the nonconducting layer of material;
   (d) patterning said polymeric material so as to form openings to partially expose the underlying layer of nonconducting material;
   (e) contacting said exposed underlying layer of nonconducting material with at least one of a palladium, platinum, silver, copper, nickel, or gold salt solution whereby palladium, platinum, copper, silver, nickel, or gold, respectively, is deposited as a seed layer; and
   (f) electrolessly plating at least one additional layer of metallization on said seed layer, and within the openings of said polymeric material, the electrolessly plated at least one additional layer of metallization, seed layer and polymeric material all forming at least a part of the final structure.

2. The method of claim 1 further comprising the step, after contacting, of heating the salt solution to a temperature sufficient to reduce the salt to the elemental metal.

3. The method of claim 1 wherein the nonconducting layer of material comprises semiconductor particles and further comprising the step, during contacting, of irradiating the semiconductor particles with a light source that excites the semiconductor particles into being conductive.

4. The method of claim 3 wherein the semiconductor particles are selected from the group consisting of $TiO_2$, $WO_3$, $Al_2O_3$, $RuO_2$ and $ZnO_2$.

5. The method of claim 1 wherein said nonconducting layer of material is a sol-gel.

6. The method of claim 5 wherein said sol-gel comprises a silicon alkoxide

7. The method of claim 1 wherein the at least one additional layer of metallization that is electrolessly plated in step (f) is sequential layers of nickel, copper and nickel.

8. The method of claim 1 wherein the dielectric substrate is a ceramic substrate.

9. The method of claim 1 wherein the dielectric substrate is a nonmetallic substrate.

10. The method of claim 1 wherein the layer of polymeric dielectric material comprises a polyimide.

11. The method of claim 3 wherein the semiconductor particles are $TiO_2$.

\* \* \* \* \*